United States Patent [19]

Jones, Jr. et al.

[11] Patent Number: 4,835,118
[45] Date of Patent: May 30, 1989

[54] NON-DESTRUCTIVE ENERGY BEAM ACTIVATED CONDUCTIVE LINKS

[75] Inventors: Robert E. Jones, Jr., Colorado Springs; Lee Kammerdiner, Avondale; Michael R. Reeder, Colorado Springs, all of Colo.

[73] Assignee: INMOS Corporation, Colorado Springs, Colo.

[21] Appl. No.: 29,192

[22] Filed: Mar. 23, 1987

Related U.S. Application Data

[62] Division of Ser. No. 905,298, Sep. 8, 1986, abandoned.

[51] Int. Cl.$^4$ .......................................... H01L 21/265
[52] U.S. Cl. ..................................... 437/173; 437/16; 437/19; 437/20; 437/228; 437/233; 437/191; 437/247
[58] Field of Search ................... 437/921, 922, 24, 25, 437/173, 174, 191, 193, 186, 233, 247, 16, 19, 20; 148/DIG. 55, DIG. 91, DIG. 92, DIG. 93; 219/121 L, 121 LH; 397/2, 40, 51, 91

[56] References Cited

U.S. PATENT DOCUMENTS

| 3,564,354 | 2/1971 | Aoki et al. |
| 3,653,999 | 4/1972 | Fuller |
| 4,135,292 | 1/1979 | Jaffe et al. |
| 4,174,521 | 11/1979 | Neale |
| 4,240,843 | 12/1980 | Celler et al. ................. 148/DIG. 55 |
| 4,387,503 | 6/1983 | Aswell et al. ........................ 437/921 |
| 4,432,008 | 2/1984 | Malthiel |
| 4,462,150 | 7/1984 | Nishimura et al. |
| 4,476,478 | 10/1984 | Noguchi et al. ............. 148/DIG. 55 |
| 4,536,949 | 8/1985 | Takayama et al. ................. 437/922 |
| 4,538,344 | 9/1985 | Okumura et al. |
| 4,569,120 | 2/1986 | Stacy et al. |
| 4,569,121 | 2/1986 | Lim et al. |
| 4,602,420 | 7/1986 | Saito ..................................... 437/922 |
| 4,651,409 | 3/1987 | Ellsworth et al. ......... 148/DIG. 55 |

FOREIGN PATENT DOCUMENTS

2100057  5/1981  United Kingdom .

OTHER PUBLICATIONS

IBM Technical Disclosure Bulletin, vol. 21, No. 3, (Aug. 1978), p. 1086.

M. Miyao et al., "Electron Irradiation-Activated Low-Temperature Annealing of Phosphorus-Implanted Silicon", Appl. Phys. Lett. 48(17), p. 1132, (Apr. 1986).

J. F. Gibbons, "Ion Implantation in Semiconductor-Part II: Damage Production and Annealing", Proceedings of the IEEE, vol. 60, No. 9, p. 1062, (Sep. 1972).

R. Chow et al., "Activation and Redistribution of Implanted P and B in Polycrystalline Si by Rapid Thermal Processing", Journal of Vacuum Science and Technology/A, vol. 3, No. 3, Part 1, p. 892, (May–Jun. 1985).

"Laser Polysilicon Link Making", Donald F. Parker, et al., Institute for Solid State Electronics, Dept. of Elec. Eng., Texas A & M University.

"A High-Speed Hi-CMOSII 4K Static RAM," Osamu Minato, et al., IEEE Journal of Solid State Circuits, vol. SC-16, No. 5, Oct. 1981, pp. 449–453.

"Low Resistance Laser Formed Lateral Links," J. A. Yasaitis, et al., III Electron Device Letters, vol. ED-L-3, No. 7, Jul. 1982, pp. 184–186.

(List continued on next page.)

Primary Examiner—Olik Chaudhuri
Assistant Examiner—Kevin McAndrews
Attorney, Agent, or Firm—Edward D. Manzo

[57] ABSTRACT

A process of manufacturing selectively restructurable conductive links between circuit elements and corresponding spare elements on a semiconductor. A continuous green light laser directed at a non-conductive amorphous region in the links causes the region to recrystallize. This makes the link electrically conductive thereby joining the circuit elements to a corresponding spare element on the semiconductor. The method permits for high density packing of circuit elements and creates a link without producing bulk material movement.

29 Claims, 4 Drawing Sheets

OTHER PUBLICATIONS

"Laser Induced Personalization & Alterations of LSI & VLSI Circuits," James F. Smith, et al., Proceedings of the First International Laser Processing Conf., Nov. 16-17, 1981, Anaheim, California, Laser Institute of America (no page numbers).

"Laser Programmes VIAS for Restructable VLSI," J. I. Raffel, et al., International Electron. Devices, Meeting, Technical Digest, 1980, pp. 132-135.

"Laser Linking Process for Restructurable VLSI," G. H. Chapman, et al., Conferences on Lasers and Electro-Optics, IEEE, New York, 1982.

"Connecting Conductors on Semiconductor Devices by Lasers,", Mikio Hongo, et al., Conference on Lasers and Electro-Optics, IEEE, New York, 1982.

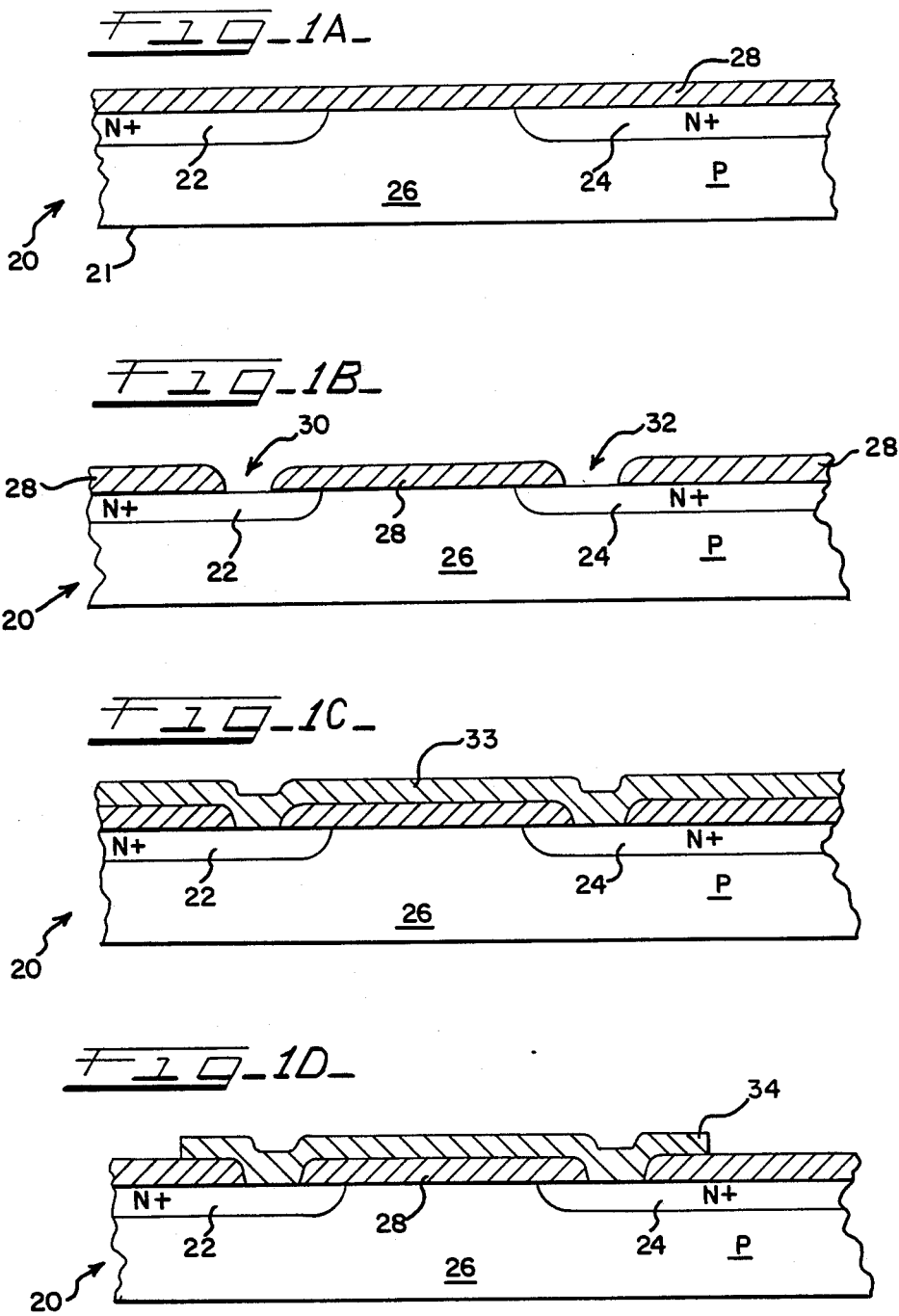

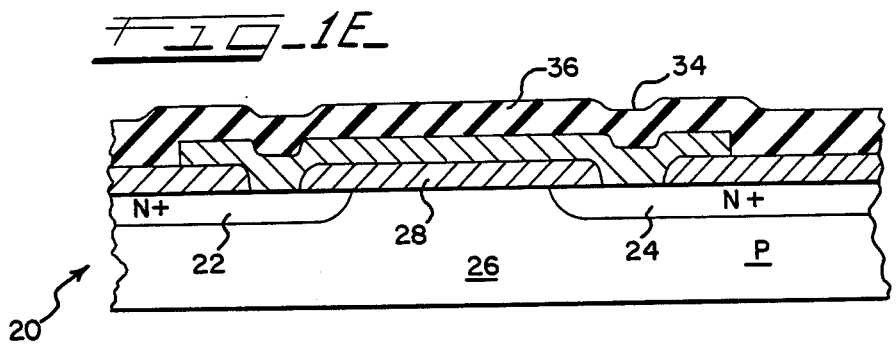
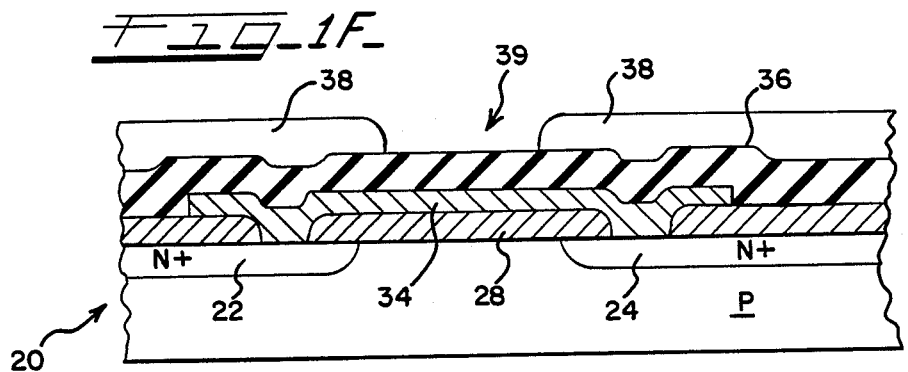
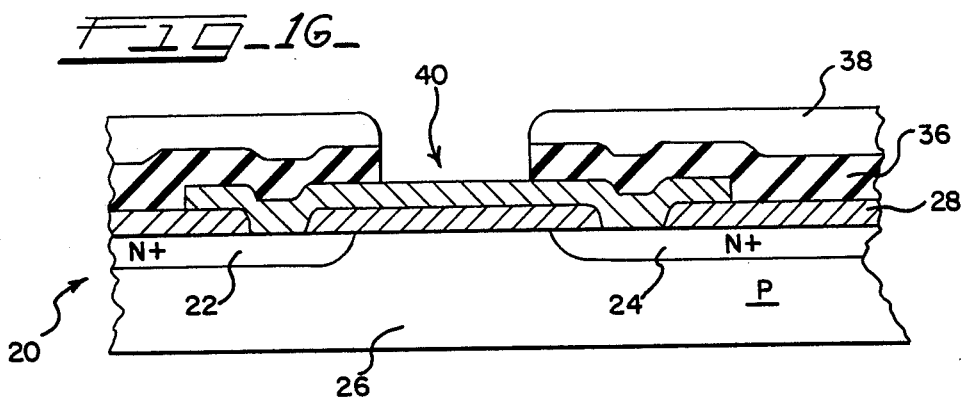

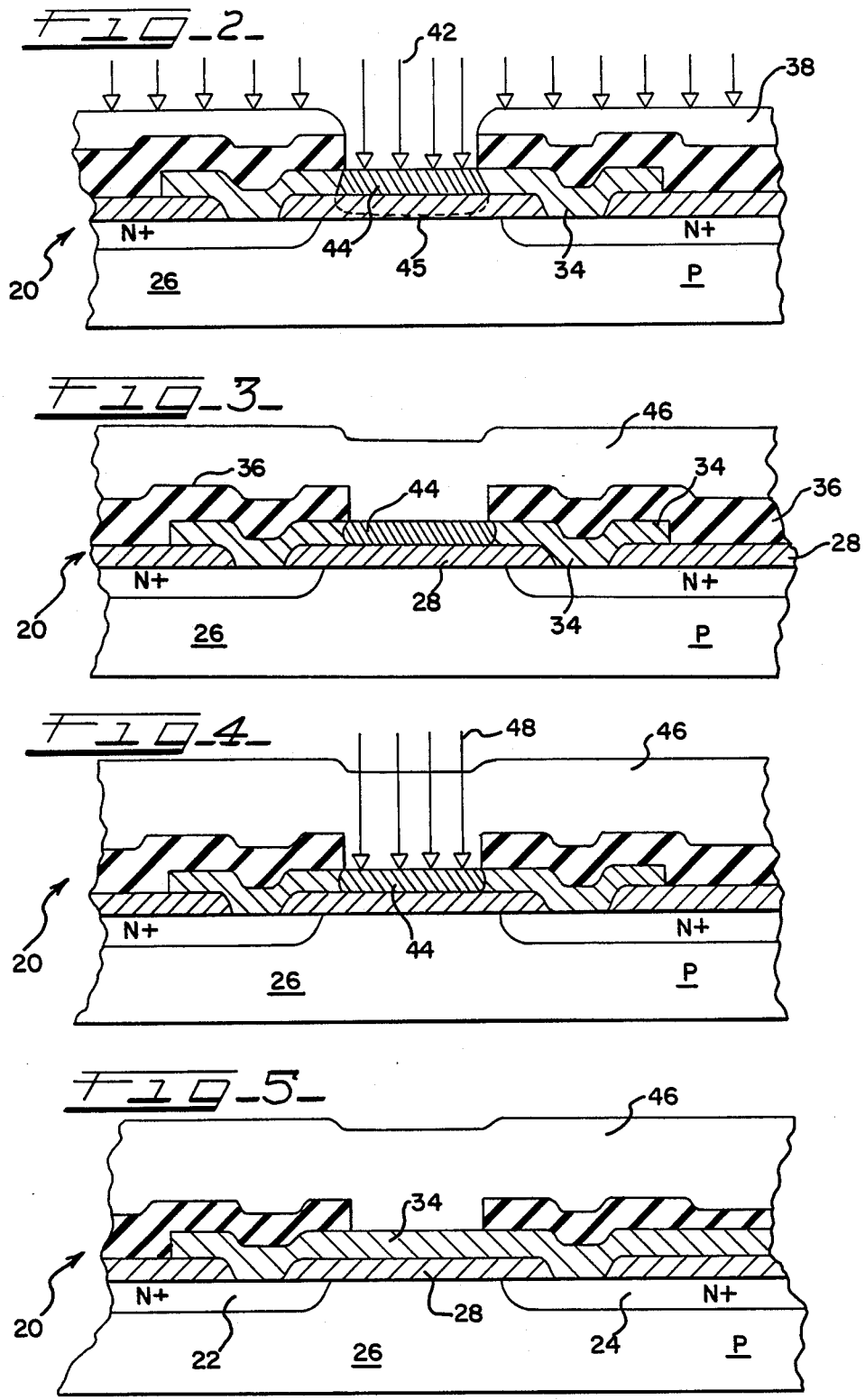

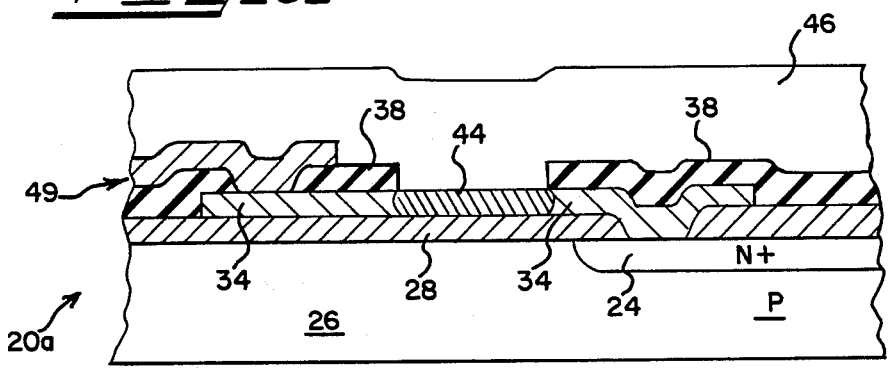
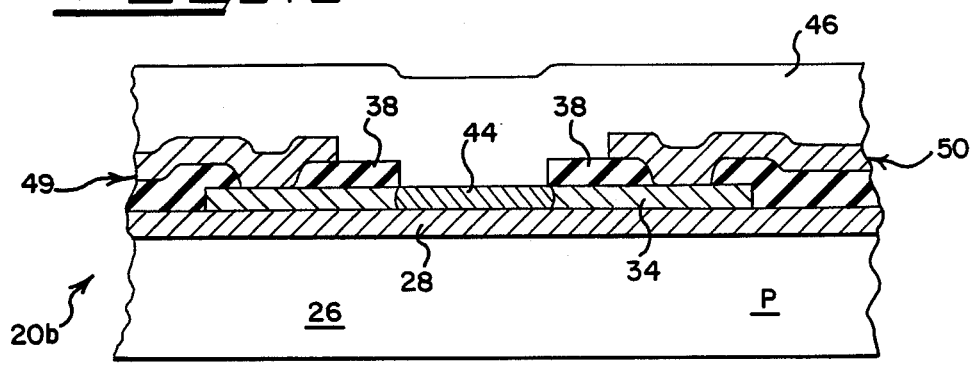
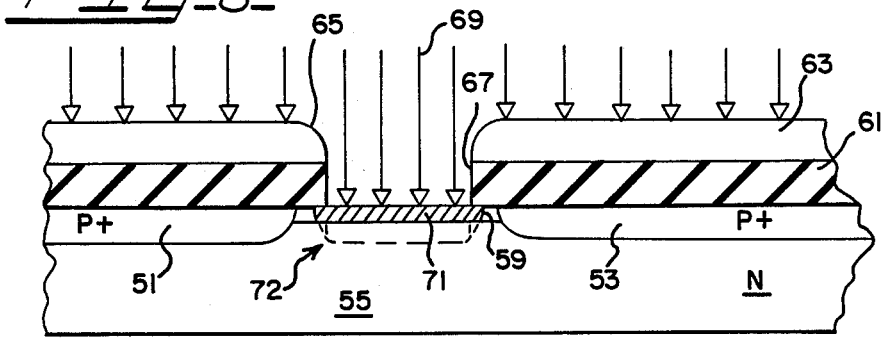

NON-DESTRUCTIVE ENERGY BEAM ACTIVATED CONDUCTIVE LINKS

This is a division of application Ser. No. 905,298 filed Sept. 8, 1986, now abandoned.

FIELD OF THE INVENTION

The present invention relates to an integrated circuit and more particularly to an integrated circuit having selectively reconfigurable circuit elements.

BACKGROUND OF THE INVENTION

High efficiency semiconductor chips are possible due to large concentrations of circuit elements on a single chip. However, as the number of circuit elements on a chip increase, so also increases the probability that a circuit element will fail rendering the total chip unusable. To prevent such a loss, additional circuit elements have been designed into the chips. Defective circuit elements are identified and then disconnected, and selected additional spare elements are connected to produce a working chip. This ability to use additional circuit elements to reconfigure a circuit design produces a higher yield in semiconductor production. In addition, the ability to selectively disconnect or connect circuit elements on a chip or wafer can be used to provide customization wherein the reconfiguration of the circuit is employed to modify the function of the circuit.

Additionally, in wafer scale integration, a number of selectable integrated circuit devices are fabricated on a wafer. In general, the devices need not all be of the same type. After testing, the appropriate functional devices are electrically connected together to make the overall circuit on the wafer. Both redundancy and customization may be involved in the selection of devices and their connections. The ability to make electrical connections is a great advantage over the ability to break connections since this allows testing of the individual integrated circuit devices.

In order to remove a defective or undesired circuit element from the good or desired circuit elements, an existing conductive link joining the defective circuit element to the good circuit elements can be restructured to produce an electrically non-conductive link. The most common restructurable conductive path technique for integrated circuits is to destroy the existing link. In destructive techniques, the link (fuse) can be melted by directing a very large current through the link, or it may be vaporized by a powerful energy beam. Both the melting and vaporizing approaches produce a gap in the link which renders the link electrically non-conductive. The gap is created as a result of the high energy applied to the link which produces a movement or transport of conductive material out of the link.

Methods for activation of a spare circuit element or "writing of a conductive link" can also involve the bulk transport of conductive material. These activation methods are "mass additive" as opposed to "mass substrative" in that material is added in to form an electrically conductive link rather than subtracted out to destroy an electrically conductive link. Such methods are described by J. Raffel, M. Naiman, R. Burke, G. Chapman, and P. Gottschalk, "Laser Programmed Vias For Restructurable VLSI," *International Electron Device Meeting* (IEDM), pp. 132-135 (1980); and J. Yasaitis, G. Chapmen, and J. Raffel,"Low Resistance Laser Formed Lateral Links," *IEEE Electron Device Letters*, EDL-3, pp. 184-186 (1982).

Both the mass additive and mass subtractive techniques have several disadvantages. One disadvantage is that whenever there is forced movement of material, some portions of that material will splatter onto other areas of the chip. The splattered material can produce flaws in other circuit elements. A further disadvantage of these methods is that they require a high energy input which will destroy any passivation layer over the link and which is capable of inflicting thermal damage to surrounding circuits. As a result, these methods impose design rules which limit how close circuit elements can be placed to each other, and therefore are not beneficial in very high density semiconductor chips.

Other methods which do not require the material movement associated with mass additive and mass subtractive techniques are also known. One of these techniques requires a region of undoped polycrystalline material to serve as a link positioned between two retions of heavily doped polycrystalline material. The link of undoped material is essentially electrically nonconductive. However, a laser beam provides an energy source to activate dopant atoms from the neighboring heavily doped semiconductor regions causing them to diffuse into the undoped link. The diffused dopant atoms turn the link into an electrically conductive path joining the two heavily doped regions. This technique is described in articles by: O. Minato, T., Masuhara, T. Sasaki, Y. Sakai, and K. Yashizaki, "A High-Speed Hi-CMOS II 4K Statis RAM," *IEEE J. Solid-State Circuits*, SC-16, pp. 449-453 (1981); and M. Hongo, T. Miyauchi, H. Yamaguchi, T. Masuhara, and O. Minato, "Connecting Conductors On Semiconducting Devices by Lasers," *Conference on Lasers and Electro-Optics, IEEE*, p. 62 (1982).

While this technique does produce an electrically conductive link, the link still has an undesirably high resistance of 500 or more ohms. But an even greater disadvantage of this technique is the requirement that the undoped polycrystalline region remain undoped during the manufacturing process of the chip. This requires additional masking steps to protect the undoped region and prevents the use of economical doping techniques such as thermal diffusion or blanket ion implantation methods.

Another technique of laser activation of conductive links between circuit elements is described in U.S. Pat. No. 4,462,150 to Nishimura et al. issued July 31, 1984 for "Method of Forming Energy Beam Activated Conductive Regions between Circuit Elements;" and by D. L. Parker, F. Lin, and D. Zhang, "Laser Polysilicon Link Making," *IEEE Trans. on Components, Hybrids, and Manufacturing Technology*, CHMT-7, pp. 438-442 (1984). This technique requires the formation of an undoped region of polycrystalline material between two doped regions of polycrystalline material. Then dopant atoms are implanted in the undoped portion and left unannealed. A laser beam can then be directed at the link region to provide the energy to anneal the region to produce a conductive link. This technique does produce links of low resistance, but to achieve a low resistance, dopant atoms must be provided in doses of $5 \times 10^{15}$ atoms/cm$^2$ or more. Further, this technique still requires the creation of an initial undoped region of polycrystalline material which necessitates more complicated doping techniques including an additional masking step.

Accordingly, a general object of the present invention is to provide a method of reconfiguring conductive paths for integrated circuits without the material splatter and circuit damage problems associated with the high power intensities of prior art techniques while avoiding the process complications associated with the use of undoped, intrinsic link regions.

An additional object is to eliminate the need of maintaining an undoped intrinsic region of polycrystalline material.

A further object is to utilize a relatively low ion implant dose to create a nonconducting link.

Yet another object is to enable restructuring of circuit element connections without destruction of the passivation dielectric layer.

SUMMARY OF THE INVENTION

During formation of a typical integrated circuit on a semiconductor substrate, an additional element is formed connected to another circuit element through an electrically conductive link comprising polysilicon, for example. A portion of that link is then bombarded with atoms which heavily damage whatever lattice structure thereof exists thereby producing a non-conductive amorphous region penetrating through the polysilicon link. This amorphous, heavily damaged region electrically separates the additional element from the circuit elements. The atoms may be neutral or, in the preferred embodiment, ions of the same conductive type as the dopant in the doped polysilicon link. The circuit elements and link are then covered with at least one layer of a dielectric material. To establish a new electrically conductive path in the semiconductor device, an energy beam is directed through the overlying dielectric layer at the non-conductive amorphous region of the link. The energy from the beam allows the amorphized region to recrystallize the lattice and become electrically conductive thereby joining the additional element to the previously formed circuit element.

The various features of novelty which are believed to characterize the invention are pointed out in the claims annexed to and forming a part of this disclosure. For a better understanding of the invention, its process advantage and specific objects attained by its uses, reference should be made to the accompanying drawings and detailed description in which the preferred embodiment of the invention is illustrated.

BRIEF DESCRIPTION OF THE DRAWINGS

FIGS. 1A-1G show cross-sectional segment views illustrating steps in the production of a preferred embodiment of the present invention;

FIG. 2 shows the link of FIG. 1G undergoing atom implantation;

FIG. 3 shows the link of FIG. 2 with an amorphous region and a dielectricl layer over the surface of the wafer;

FIG. 4 shows the link of FIG. 3 undergoing energy beam activation of the amorphized region;

FIG. 5 shows the link of FIG. 3 after recrystallization;

FIG. 6 shows a cross-sectional view illustrating another preferred embodiment similar to the link of FIG. 3 but connecting a metal circuit element to a selected additional circuit element;

FIG. 7 shows a cross-sectional view illustrating another preferred embodiment similar to the link of FIG. 3 but connecting two metal circuit elements; and FIG. 8 shows a cross-sectional view illustrating another embodiment of the novel link.

DETAILED DESCRIPTION OF THE PREFERRED EMBODIMENTS

While the invention will be described in connection with several preferred embodiments, it will be understood that it is not intended to limit the invention to these embodiments. On the contrary, it is intended to cover all alternatives, modifications and equivalents as may be included in the spirit and scope of the invention as defined by the appended claims, now and as they may be amended from time to time.

Turning first to FIG. 1A, one embodiment 20 shows a cross-section of a semiconductor wafer having a first circuit element 22 and a second circuit element 24 formed in a P type substrate 26. While the circuit elements are shown as N+ in a P type substrate for illustration purposes, it is to be understood that this is exemplary, and one skilled in the art could have N+ circuit elements on a P type substrate or use the same process with P+ doped circuit elements in or on an N type substrate. A first dielectric layer 28 of $SiO_2$ or other suitable material is formed over the surface of substrate 26 and circuit elements 22 and 24 by a conventional method such as chemical vapor deposition (CVD) or thermal growth. Using a conventional photolithography etching technique, contact openings 30 and 32 are etched through dielectric layer 28 to expose a portion of first circuit element 22 and second circuit element 24 resepctively (FIG. 1B). Then, as shown in FIG. 1C, a doped polysilicon film 33, connected through opening 30 to first circuit element 22 and through opening 32 to second circuit element 24 is formed on layer 28 by a conventional vapor deposition process. The doping of a polysilicon film 33 can be achieved by various means including thermal diffusion from a dopant source, blanket ion implantation or in situ doping during deposition. In the preferred embodiment, the doped polysilicon film is an N+ doped polycrystalline silicon. As shown in FIG. 1D, polysilicon film 33 is then masked and etched to form a polysilicon link 34 between first circuit element 22 and second circuit element 24 and spaced from these circuit elements by layer 28. The link is preferably 2000 angstroms thick and has a concentration of dopant atoms of $2 \times 10^{20}$ to $1 \times 10^{21}/cm^3$ but may range in thickness from 400 to 4000 angstroms with a concentration range of $1 \times 10^{19}$ $1 \times 10^{21}/cm^3$. As illustrated in FIG. 1E, a second dielectric layer 36 is then formed over doped polysilicon link 34 by a conventional process such as vapor deposition or thermal growth.

Next a masking step is done. A conventional photoresist film 38 is formed on top of second dielectric layer 36 and patterned by a photolithography process to create an opening 39 in film 38 over an underlying area of link 34 between circuit elements 22 and 24 (FIG. 1F). As shown in FIG. 1G, a conventional etching process is then employed to open a window 40 through second dielectric layer 36 to expose a portion of underlying link 34.

As illustrated in FIG. 2, the wafer is then exposed to a bombardment of dopant atoms 42, or the like for the purpose of implanting dopant atoms into the exposed portion of link 34. While photoresist layer 38 could be removed prior to the atom bombardment, in the preferred embodiment it is left in place to provide added protection along with second dielectric layer 36 against the implantation of dopant atoms in areas other than the exposed portion of link 34. Dopant atoms 42 are of a sufficient energy and dose to heavily damage the lattice of link 34 joining circuit element 22 to circuit element 24. This creates an essentially non-conductive portion herein referred to as an amorphous region 44 extending through the exposed portion of link 34 and into layer 28 as illustrated by a dashed line 45. The amorphous region 44 penetrating the entire depth of link layer 34 presents a region of extremely low conductivity thereby electrically separating first circuit element 22 from second circuit element 24.

The atom bombardment may consist of dopant ions of the same conductive type as doped polycrystalline silicon layer 34 or may consist of neutral atoms, or may consist of dopant ions of the opposite conductive type as the doped polycrystalline silicon with the restriction that the implant dose be insufficient to compensate the original dopant compensation. For example, boron or preferably boron difluoride ions may be implanted into P+ silicon, or as in the illustrated preferred embodiment, phosphorous or arsenic ions may be implanted into the N+ polycrystalline silicon. The atoms should have an energy in the range of 30 to 300 keV and be implanted in a dosage of $1 \times 10^{14}/cm^2$ to $5 \times 10^{15}/cm^2$. The dose and energy of the implant are chosen so that the amorphous region extends through the conductive link. The appropriate dose and energy depend on the type of ions implanted as well as on the thickness of the conductive link. Lighter implanted ions require a higher dose but a lower energy to achieve a required amorphous region whereas heavier implanted ions require a lower dose but a higher energy. In the illustrated preferred embodiment for a 2000 angstrom thick N+ conductive link having $1 \times 10^{21}/cm^3$ dopant concentration, the required amorphous region can be created with a $1 \times 10^{15}/cm^2$, 100 keV implant of phosphorous ions. Averaged through the conductive link thickness, the contribution of this implant to the total concentration is less than $5 \times 10^{19}/cm^3$. A similar P+ conductive link (not shown) having an initial boron concentration of $3 \times 10^{20}/cm^3$ could have the required amorphous region created with the same dose and energy implant of phosphorous ions as is required for the N+ conductive link 34 described above. Upon recrystallization, this P+ link would return to P+ type with only a limited reduction in conductivity due to the partial compensation provided by the phosphorous ions. Thus, in an alternative embodiment having both an N+ link joining circuit elements and a P+ link joining circuit elements, a single implant step would create amorphous regions in both the N+ and the P+ conductive links on the same wafer. This eliminates the requirement of an additional masking step and an additional implant step to first create an amorphous region in one link and then to create an amorphous region in the other type link. Alternatively a 100 keV, $1 \times 10^{15}/cm^2$ implant of silicon or argon could be used to simultaneously or individually create amorphous regions in both the N+ and the P+ links.

After creation of amorphous region 44 in link 34, the processing temperatures are kept below 600° C. in order to prevent activation of the links. As shown in FIG. 3, the photoresist layer 38 is removed, and in the preferred embodiment a conventional passivation dielectric layer 46 of Phosphorous Silicon Glass (PSG) or other suitable material is then deposited on the wafer, preferably by either a conventional chemical vapor deposition process or a sputter process in order to prevent generating temperatures greater than 600° C. in the amorphized region 44. The conventional passivation dielectric layer is highly preferred but not required to make the device work.

As shown in FIG. 4, amorphous region 44 can be selectively converted to have its damaged lattice recrystallized to polycrystalline silicon under the influence of an energy beam 48 directed by a conventional computercontrolled aiming technique through passivation dielectric layer 46 onto amorphous region 44. The energy may be a conventional energy beam such as an electron beam or a laser. In the preferred embodiment, energy beam 48 is a continuous wave green light laser having an energy of 0.05 to 1.0 $J/cm^2$, with a beam width of approximately the same width as the width of the amorphous region in the actuatable link. In the preferred embodiment, the width of the amorphous region would be 1.0 to 4.0 micrometers.

As depicted in FIG. 4, energy beam 48 penetrates passivation dielectric layer 46 without causing any damage to layer 46. Energy beam 48 raises the temperature of the amorphous region 44 above 600° C. and preferably above 900° C. This supplies the needed energy for recrystallization of the amorphous region and activation of the dopant. Amorphous region 44 recrystallizes at temperatures of 600° C. and above by either solid phase recrystallization or local melting and resolidification. Temperatures above 900° C. are beneficial in terms of obtaining better activation of the dopant atoms present in region 44. These higher temperatures also are preferred for the more rapid recrystallization. To prevent destruction of the overlaying passivation layer, its melting temperature must not be reached, nor can the silicon reach its vaporization temperature. Depending on the materials employed, further temperature limits may be required to prevent excessive interface interactions. As amorphous region 44 recrystallizes, the conductivity of link 34 increases.

As shown in FIG. 5, conversion of amorphous region 44 to polycrystalline silicon allows link 34 to serve as an electrically conductive path between first circuit element 22 and second circuit element 24.

FIG. 6 illustrates another embodiment 20a or application of this invention which is a modification of the structure discussed in FIGS. 1A through FIG. 5 without circuit element 22. FIG. 6 shows this embodiment at the same stage of creation as shown in FIG. 3 for the previously discussed embodiment. However, prior to forming amorphous region 44 a window is formed in second dielectric layer 38 and a metal circuit element 49 is formed contacting link 34 through the window. The polycrystalline silicon link 34 with amorphous region 44 connects metal circuit element 49 to selectable circuit element 24 in the semiconducting substrate 26. The amorphous region is then recrystallized as described with reference to FIGS. 4 and 5.

FIG. 7 illustrates a third embodiment 20b or application of this invention which is again a modification of the structure discussed in FIG. 1A through 5A this time without circuit elements 22 and 24. FIG. 7 shows this embodiment at the same stage of creation as shown in FIG. 3 for the first discussed embodiment, however, prior to formation of amorphous region 44, two windows are formed in second dielectric layer 38 above areas on opposite sides of underlying link 34. Metal circuit element 49 and another metal circuit element 50 are formed contacting link 34 through the windows.

The amorphous region is then formed as described above. The polycrystalline silicon link 34 with amorphous region 44 connects metal circuit element 49 to metal circuit element 50, both of which are formed in the layers above the semiconductor substrate. The amorphous region may be recrystallized as described with reference to FIGS. 4 and 5. Illustratively, circuit element 49 represents part of a read/write bus in a semiconductor memory chip and element 50 represents an extension to a selectable additional column of (redundant) memory cells. Alternatively, circuit element 40 could represent part of an output bus line in one semiconductor device and element 50 could represent part of an input bus line for a selectable device of a wafer level integrated circuit. It will be understood that many other applications can be found for this invention.

In both FIGS. 6 and 7 the preferred embodiment is for the creation of the amorphous region to follow the disposition and patterning of metal layer 49 (and metal layer 50 in FIG. 7). The creation of amorphous region 44, however, could also occur prior to metal deposition with the option of an additional dielectric layer between the amorphous region and the metal layer deposition (not shown).

FIG. 8 illustrates yet another embodiment 20c of the invention which is a modification of the structure discussed in FIGS. 1A-5 above. A first circuit element 51 and a second circuit element 53 are formed in the surface of a substrate 55 of a semiconductor wafer. A shallow link 59 formed of the same material as the circuit elements creates a conductive path joining first circuit element 51 to second circuit element 53. In the illustrated embodiment, the circuit elements and the link are formed of P+ type material and the substrate is of N type material. A conventional dielectric layer 61 of $SiO_2$ or other suitable material is formed on the wafer surface by conventional means such as chemical vapor deposition or thermal growth. Layer 61 covers the circuit elements and link 59. A conventional photoresist layer 63 is then formed on the wafer, and an opening 65 is formed above a portion of link 59 to allow a window 67 to be etched through dielectric layer 61 to expose shallow link 59. The wafer is then subjected to an atom bombardment 69 which creates an amorphous region 71 penetrating through the entire depth of link 59 and into the substrate as illustrated by a dashed line 72. Amorphous region 71 is nonconductive and therefore electrically separates first circuit element 51 from second circuit element 53. The preferred implant for this preferred embodiment is of nondoping ions such as silicon or argon. This prevents leakage conductivity around the edge of the amorphous region.

As explained in the previous examples with reference to FIGS. 3-5 above, photoresist layer 63 is then removed and at least one dielectric layer 46, depending upon the wafer design, is deposited over the wafer covering the exposed amorphous region. A user may then selectively activate amorphous region 71 by directing an energy beam 48 through dielectric layer 46 onto the underlying amorphous region. The energy beam, as explained in the above example, provides the energy which produces recrystallization of the amorphous region, making link 59 once again conductive.

The invention allows a user to activate links selectively in semiconductor circuits joining a first circuit element to a second circuit element without destroying an overlying dielectric layer. The invention has the advantage of eliminating the need of creating undoped regions between circuit elements. Circuit elements can be tightly packed without a danger of splatter or thermal damage when reinforcing redundancy circuit, so design rules can be relaxed.

It will be understood that these specifications and drawings are illustrative and that variation in the steps and configurations is within the scope of the invention. For example, other means known in semiconductor arts can be employed to render region 44 amorphous or to recrystallize it. As a further example, one or both of the circuit elements contacted by the selectively actuatable conductive link could be silicide or polycrystalline silicon elements formed in the layers above the semiconductor substrate. Yet another alternative would be to use a processing sequence when photoresist alone, rather than photoresist over a dielectric layer, defines the window for the ion beam implant to create the amorphous region. The present specification is not intended to exclude such variations.

What is claimed is:

1. A method of manufacturing semiconductor devices having selectively activatable links between circuit elements comprising the steps of:
    forming a conductive semiconductor circuit element on a semiconducting substrate;
    forming a dielectric layer over at least said semiconductor circuit element;
    forming an opening in said dielectric layer to expose a portion of said semiconductor circuit element;
    creating a region having a very low conductivity in said exposed portion of said semiconductor circuit element by introducing into said exposed portion ions in an amount insufficient to compensate for the concentration of the previously existing dopants;
    forming at least one circuit on said semiconducting substrate;
    forming a conductive path on top of said region thereby joining said circuit element to said circuit through said opening; and
    selectively activating said region below said conductive path with an energy beam to make said region conductive thereby creating an electrically transmissive contact between said semiconductor circuit element and said circuit formed on said semiconducting substrate.

2. A method as in claim 1 including the additional step of
    forming a passivation dielectric layer over at least said conductive path prior to selectively activating said region.

3. A method according to claim 2 wherein said energy beam passes through said passivation dielectric layer to raise said region temperature to greater than 600° C. without affecting said passivation dielectric layer.

4. A method as in claim 1 wherein said region is created by introducing into said exposed portion ions of the same conductivity type as the dopant previously existing in said exposed portion.

5. A method according to claim 1 wherein said doped semiconductor circuit element is formed of N+ doped polycrystalline silicon and said creating step includes introducing phosphorus ions into said exposed portion.

6. A method as in claim 1 wherein said doped semiconductor circuit element is formed in said semiconducting substrate.

7. A method as in claim 6 wherein said doped semiconductor circuit element is N+ doped and said creating step includes introducing phosphorus ions into said exposed portion.

8. A method according to claim 1 wherein said energy beam comprises an electron beam.

9. A method according to claim 1 wherein said energy beam comprises a laser beam.

10. A method according to claim 1 wherein said energy beam comprises a green light laser.

11. A method according to claim 1 wherein said energy beam comprises a laser having an energy of 0.05 to 1.0 J/cm$^2$.

12. A method according to claim 1 wherein said creating step includes introducing ions into said exposed portion in a dose of substantially $1 \times 10^{15}$/cm$^2$ with an energy of 30 to 300 keV.

13. A method according to claim 1 wherein said creating step produces said region extending at least partially into said exposed portion of said doped semiconductor circuit element.

14. A method according to claim 1 wherein said conductive path is a metal layer ranging from 5000 to 10,000 angstroms in depth.

15. A method according to claim 1 wherein said conductive path is a metal layer and wherein said metal is tungsten.

16. A method according to claim 1 wherein said region recrystallizes and becomes conductive after being raised to a temperature greater than 600° C.

17. A method of manufacturing semiconductor devices having selectively activatable links between circuit elements comprising the steps of:

forming a conductive semiconductor circuit element on a semiconducting substrate;

forming a dielectric layer over at least said semiconductor circuit element;

forming an opening in said dielectric layer to expose a portion of said semiconductor circuit element;

creating a region having very low conductivity in said exposed portion of said semiconductor circuit by introducing into said exposed portion ions of the opposite conductivity type as the dopant previously existing in said exposed portion in an amount sufficient to create said region but insufficient to compensate the initial dopant concentration;

forming at least one circuit on said semiconducting substrate;

forming a conductive path on top of said region thereby joining said circuit element to said circuit through said opening; and selectively activating said region below said conductive path with an energy beam to make said region conductive thereby creating an electrically transmissive contact between said semiconductor circuit element and said circuit formed on said semiconducting substrate.

18. A method as in claim 17 including the additional step of forming a passivation dielectric layer over at least said conductive path prior to selectively activating said region.

19. A method as in claim 18 wherein said energy beam passes through said passivation dielectric layer to raise said region temperature to greater than 600° C. without affecting said passivation dielectric layer.

20. A method as in claim 17 wherein said doped semiconductor circuit element is formed in said semiconducting substrate.

21. A method according to claim 17 wherein said energy beam comprises an electron beam.

22. A method according to claim 17 wherein said energy beam comprises a laser beam.

23. A method according to claim 17 wherein said energy beam comprises a green light laser.

24. A method according to claim 17 wherein said energy beam comprises a laser having an energy of 0.05 to 1.0 J/cm$^2$.

25. A method according to claim 17 wherein said creating step includes introducing ions into said exposed portion in a dose of substantially $1 \times 10^{15}$cm$^2$ with an energy of 30 to 300 keV.

26. A method according to claim 17 wherein said creating step produces said region extending at least partially into said exposed portion of said doped semiconductor circuit element.

27. A method according to claim 17 wherein said conductive path is a metal layer ranging from 5000 to 10,000 angstroms in depth.

28. A method according to claim 17 wherein said conductive path is a metal layer and wherein said metal is tungsten.

29. A method according to claim 17 wherein said region recrystallizes and becomes conductive after being raised to a temperature greater than 600° C.

* * * * *